United States Patent
Bailey et al.

(10) Patent No.: US 7,926,006 B2
(45) Date of Patent: Apr. 12, 2011

(54) VARIABLE FILL AND CHEESE FOR MITIGATION OF BEOL TOPOGRAPHY

(75) Inventors: Todd C Bailey, Poughkeepsie, NY (US); Ryan P. Deschner, Poughkeepsie, NY (US); Wai-Kin Li, Beacon, NY (US); Roger A. Quon, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 1051 days.

(21) Appl. No.: 11/678,163

(22) Filed: Feb. 23, 2007

(65) Prior Publication Data

US 2008/0203589 A1  Aug. 28, 2008

(51) Int. Cl.
G06F 17/50 (2006.01)
(52) U.S. Cl. ......................................................... 716/54
(58) Field of Classification Search .................... 716/19, 716/21, 54
See application file for complete search history.

(56) References Cited

U.S. PATENT DOCUMENTS

| | | | |
|---|---|---|---|
| 4,531,060 A * | 7/1985 | Suwa et al. ................... | 250/548 |
| 6,593,226 B2 | 7/2003 | Travis et al. | |
| 6,609,235 B2 | 8/2003 | Ramaswamy et al. | |
| 6,751,785 B1 | 6/2004 | Oh | |
| 6,770,554 B1 | 8/2004 | Welstand | |
| 6,774,030 B2 | 8/2004 | Marxsen et al. | |
| 6,904,581 B1 | 6/2005 | Oh | |
| 7,448,010 B1 * | 11/2008 | Lenahan et al. ................. | 716/10 |
| 2002/0050655 A1 * | 5/2002 | Travis et al. ................... | 257/798 |
| 2002/0104991 A1 * | 8/2002 | Cleeves et al. .................. | 257/48 |
| 2005/0114824 A1 * | 5/2005 | Wang et al. ...................... | 716/21 |
| 2005/0132306 A1 * | 6/2005 | Smith et al. ....................... | 716/1 |
| 2006/0157702 A1 * | 7/2006 | Sukman-Prahofer et al. .. | 257/48 |
| 2006/0225023 A1 * | 10/2006 | Adkisson et al. ............... | 716/19 |
| 2008/0046853 A1 * | 2/2008 | Ruderer et al. ................. | 716/10 |
| 2008/0120586 A1 * | 5/2008 | Hoerold ............................ | 716/9 |
| 2008/0121939 A1 * | 5/2008 | Murray et al. ................ | 257/202 |
| 2008/0201677 A1 * | 8/2008 | Baker et al. ....................... | 716/8 |
| 2009/0106725 A1 * | 4/2009 | Wang et al. ..................... | 716/10 |

OTHER PUBLICATIONS

Lee et al.; "Using Smart Dummy Fill and Selective Reverse Etchback for Pattern Density Equalization"; Mar. 2000; Massachusetts Institute of Technology; pp. 1-4.*
Kurokawa et al.; "Dummy Filling Methods for Reducing Interconnect Capacitance and Number of Fills"; 2005; Proceedings of the 6th International Symposium on Quality of Electronic Design; pp. 1-6.*

* cited by examiner

*Primary Examiner* — Jack Chiang
*Assistant Examiner* — Suresh Memula
(74) *Attorney, Agent, or Firm* — DeLio & Peterson, LLC; Peter W. Peterson; Wenjie Li

(57) ABSTRACT

A method of designing features on a semiconductor wafer. A design of active or functional features is provided for chiplets separated by kerf areas on the wafer. The method then includes determining pattern density of the chiplet features, and applying a pattern of spaced dummy features on chiplet area not covered by active or functional features, as well as in the kerf areas. The dummy features are uniformly expanded or reduced in size until a desired dummy feature pattern density is reached.

16 Claims, 14 Drawing Sheets

VARIABLE FILL AND CHEESE FOR MITIGATION OF BEOL TOPOGRAPHY

BACKGROUND OF THE INVENTION

1. Field of the Invention

The present invention relates to semiconductor devices and, in particular, to the lithographic production of semiconductor devices on a wafer.

2. Description of Related Art

Integrated circuit devices are fabricated principally by lithographic methods in spaced chiplets arranged on the semiconductor wafer surface. Front-end-of-the-line (FEOL) denotes the first portion of integrated circuit fabrication where the individual active circuit devices are patterned in chiplet regions on the wafer surface, while back-end-of-line (BEOL) denotes the portion of fabrication where the metal wiring layers for the devices are deposited. The chiplets are separated by regions on no, non-active, and/or electrical test features known as kerf regions, which provide space for the chiplets to be cut apart or diced to produce individual integrated circuit chips. Variation in pattern density within chiplets, from chiplet to chiplet, and chiplet to kerf results in severe topography differences in the BEOL. Undesirable BEOL topographical variations may result after attempts at planarizing by chemical-mechanical polishing (CMP), where regions relatively devoid of areas of metal (e.g., vias or lines) polish at rates significantly lower than those areas having a high density of metal. The BEOL topography results in a very limited common process window across the entire field, and some features printing at very different sizes due to focus offsets within the field. Solutions that have been implemented previously include rearranged the field layout so that the chiplet-kerf pattern density data (change) does not greatly tilt the focal plane. Other solutions have been proposed, such as those in U.S. Pat. No. 6,593,226, in which CMP process benchmarking is required and an algorithm is determined for iterative dummy feature placement optimization.

SUMMARY OF THE INVENTION

Bearing in mind the problems and deficiencies of the prior art, it is therefore an object of the present invention to provide a method for mitigating variations in BEOL topography during the lithographic production of integrated circuit devices on semiconductor wafers.

It is another object of the present invention to provide a method of providing fill or dummy features on levels or layers of lithographically produced electronic devices that promote uniform planarizing by chemical mechanical polishing of the wafer surface.

Still other objects and advantages of the invention will in part be obvious and will in part be apparent from the specification.

The above and other objects, which will be apparent to those skilled in the art, are achieved in the present invention which is directed to a method of designing features on a semiconductor wafer comprising providing a semiconductor wafer and providing a design of active or functional features of chiplets to be formed on the wafer. The method then includes determining pattern density of the active or functional features on the chiplets, applying a pattern of spaced dummy features on an area of at least one chiplet not covered by active or functional features, and uniformly expanding or reducing size of the dummy features until a desired pattern density of the dummy features in the area is reached.

The method may further include arranging the chiplets in the exposure field in a desired spaced layout, wherein the chiplets being separated by kerf areas, applying a pattern of spaced dummy features on the kerf areas, and uniformly expanding or reducing size of the dummy features until pattern density of the dummy features in the kerf areas substantially matches the pattern density of the dummy features in the chiplets adjacent the kerf areas. At least some of the active or functional features for the chiplets may be expanded and merged prior to determining pattern density of the features.

The patterns of dummy features may be applied to the at least one chiplet and the kerf areas sequentially or simultaneously. The pattern of spaced dummy features are preferably applied on areas of a plurality of chiplets not covered by active or functional features. The desired pattern density of the dummy features in the chiplet area may be predetermined to be substantially uniform in the plurality of chiplets, to substantially match the highest pattern density of the active or functional features in the chiplets, or to vary substantially uniformly across the exposure field.

The method may further include arranging the chiplets in the exposure field in a desired spaced layout, the chiplets being separated by kerf areas; applying a pattern of spaced dummy features on the kerf areas; and uniformly expanding or reducing size of the dummy features until pattern density of the dummy features in the kerf areas varies substantially uniformly across the field and substantially matches the pattern density of the dummy features in the chiplets adjacent the kerf areas.

Preferably the pattern density variation is in the direction of scan of the field during lithographic production.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiments of the present invention, reference will be made herein to FIGS. 1-13 of the drawings in which like numerals refer to like features of the invention.

The present invention varies the size and/or layout of so-called "fill" and "cheese" so as to mitigate local and field-scale pattern density variations. The term "fill" refers to the additions to the chiplet or kerf design of patterns (active or more typically non-active), such as metal vias, lines or other features. Non-active features are also referred to as dummy features. The term "cheese" refers to the portions of the design that replace removed portions of the active or non-active patterns that resist CMP, such as oxides, polymers or other dielectric materials more resistant to CMP than metals. By changing the size and/or layout of the fill and cheese, more uniform pattern densities can result across the entire field, which is known to mitigate pattern density variation-induced topography growth in the BEOL.

Figure 1A:
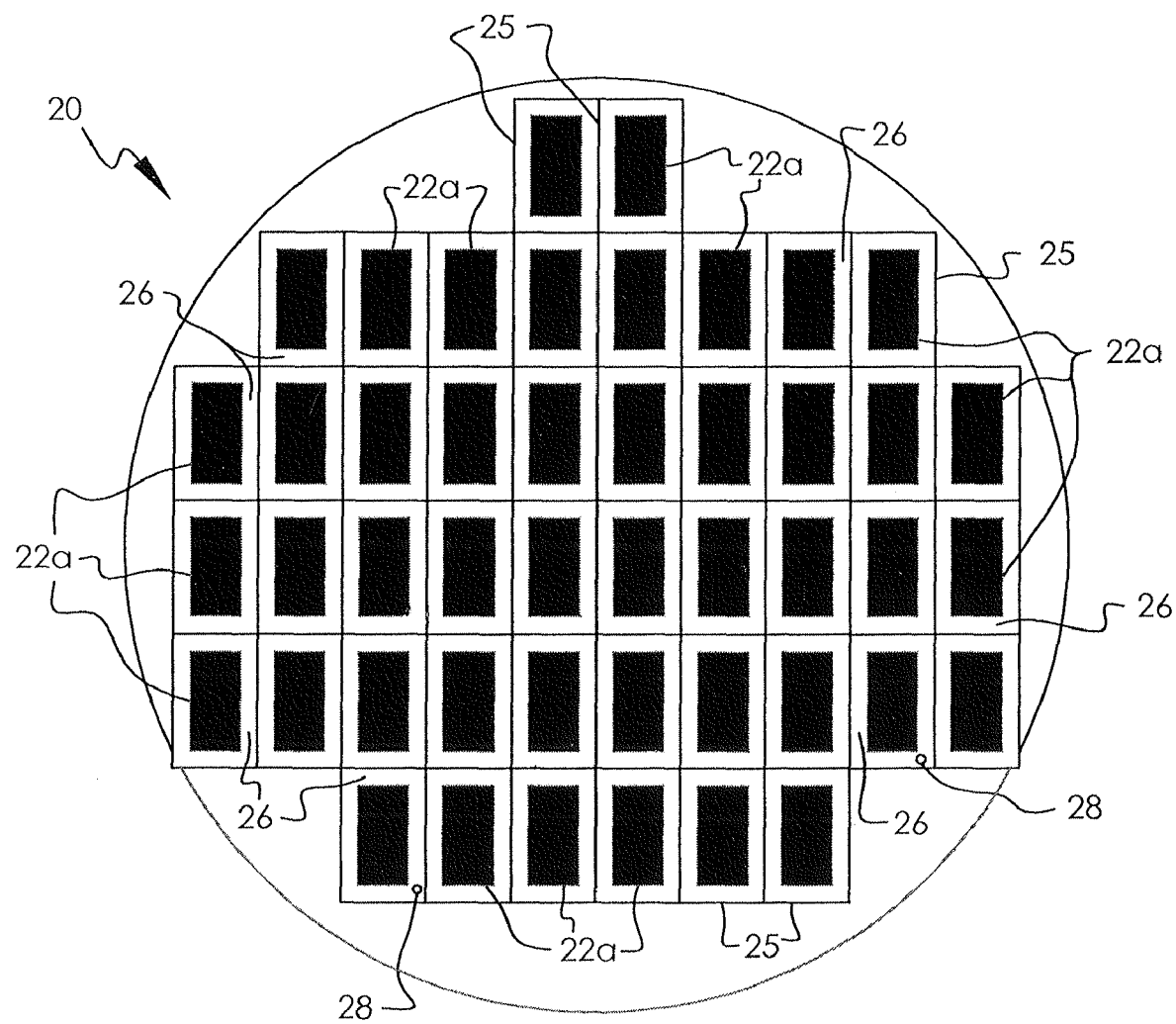
FIG. 1 is a top plan view of a wafer with chiplets and kerf areas between the chiplets having varying densities.
Figure 1B:
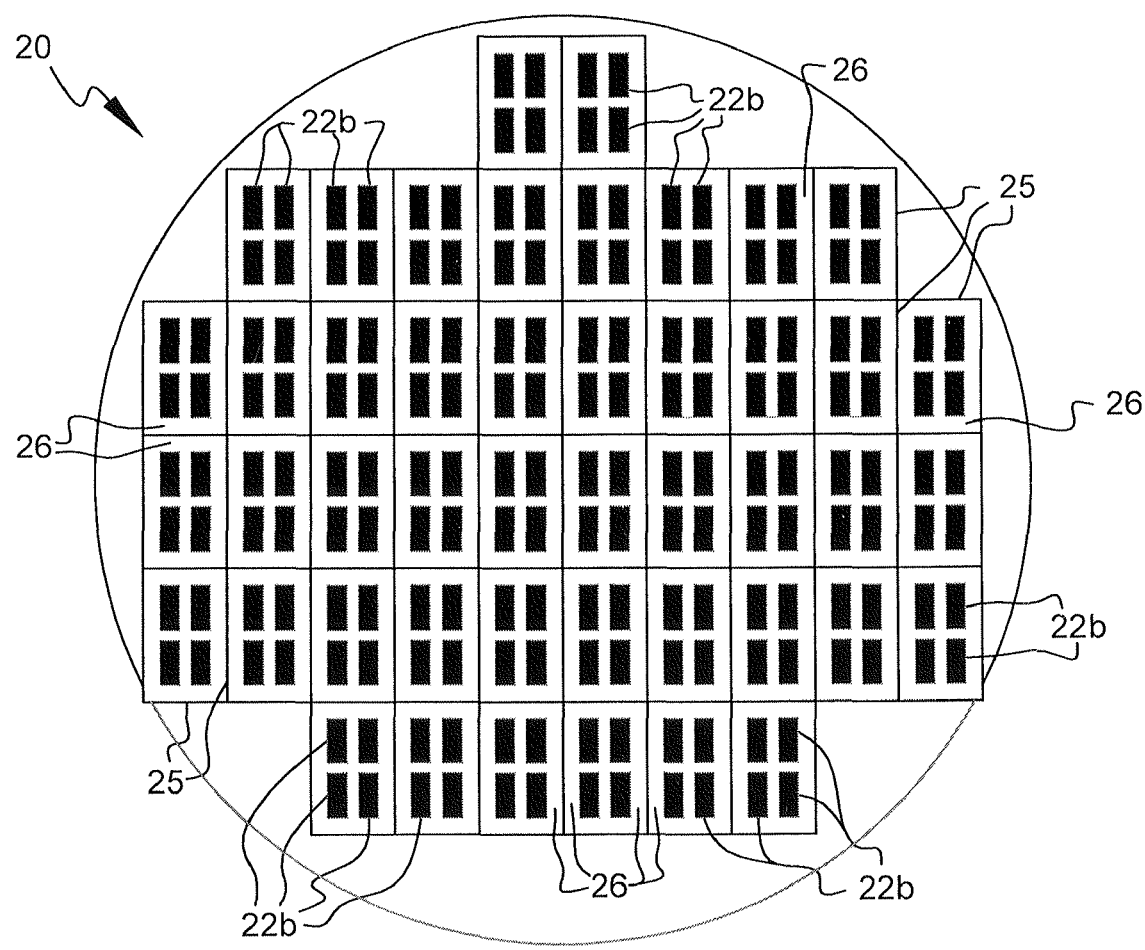
Figure 1C:
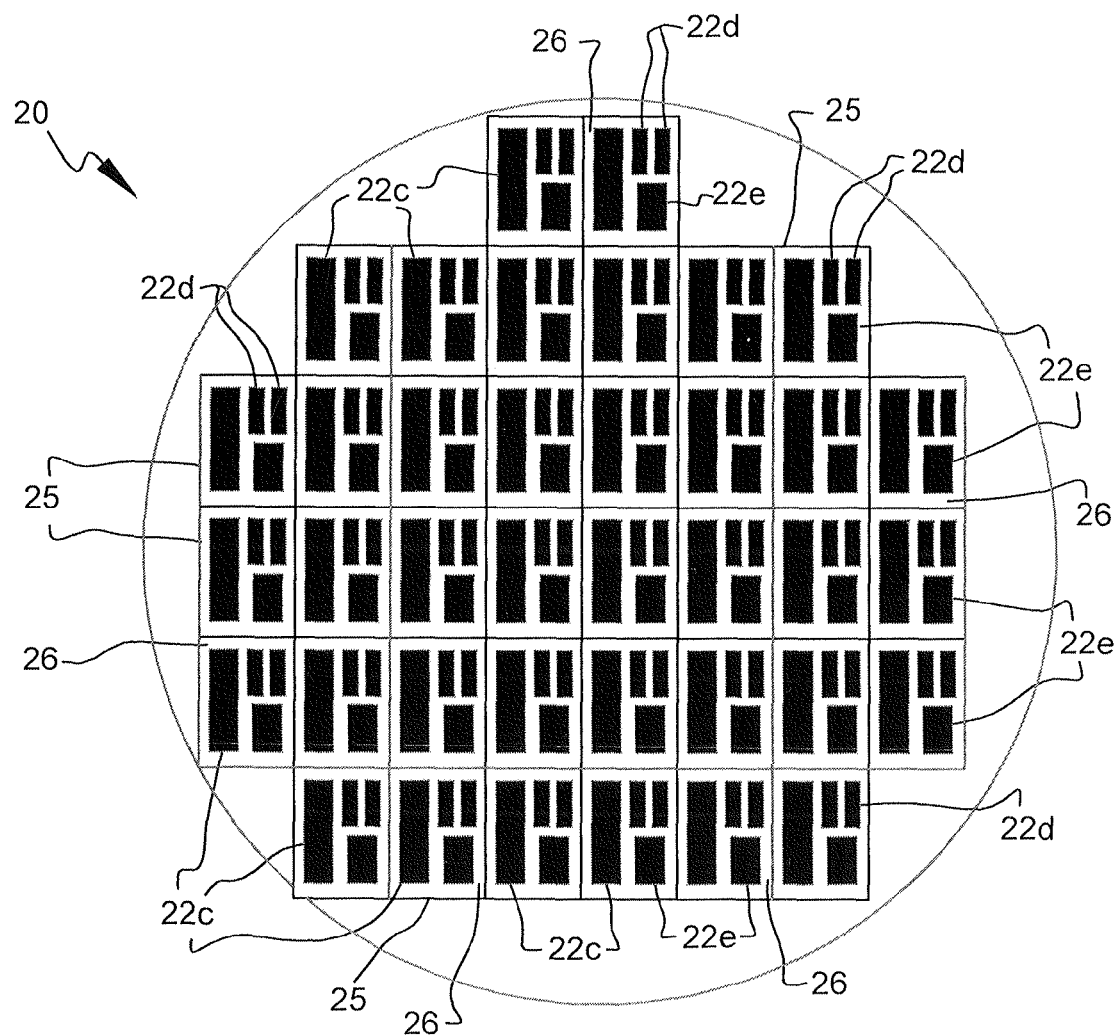

A typical semiconductor wafer 20 is shown in FIGS. 1$a$, 1$b$ and 1$c$ having chiplets arranged in a desired spaced pattern on the wafer surface. The chiplets 22$a$ (FIG. 1$a$) 22$b$ (FIG. 1$b$) and 22$c$, 22$d$, 22$e$ (FIG. 1$c$) are separated by wafer kerf areas 26 that provide the necessary separation for the wafer to be diced to separate the chiplets and produce individual microchips at the end of the wafer processing. (The rectangular lines 25 depict the edge of the exposure field for each chiplet or group, and are not printed on the wafer.) Each chiplet has active features comprising active electronic devices, connectors and other features, and may include non-active features as well. The wafer chiplets and features are produced by normal lithographic processing in layers to create the final desired structure. The kerf regions may also have features 28 (FIG. 1$a$) which may function to aid the wafer processing, for example targets used to ensure proper dose, focus or other lithographic process parameters. The active and other features depicted are metal features in a single lithographic layer that affect CMP polishing rates for that layer.

In some instances, the chiplets on the wafer are all identical, arising from a single large chiplet or arrangement of duplicate chiplets in a field, placed at all field locations across a wafer. In other instances, different chiplets are arranged within a field, which is then placed at all field locations across a wafer, this may be used to create on one wafer different chiplets for the same customer, or different chiplets for various customers These metal feature density differences may lead to undesirable topographical differences after CMP, with the low density regions having a lower elevation after polishing than the high density regions.

Figure 2:
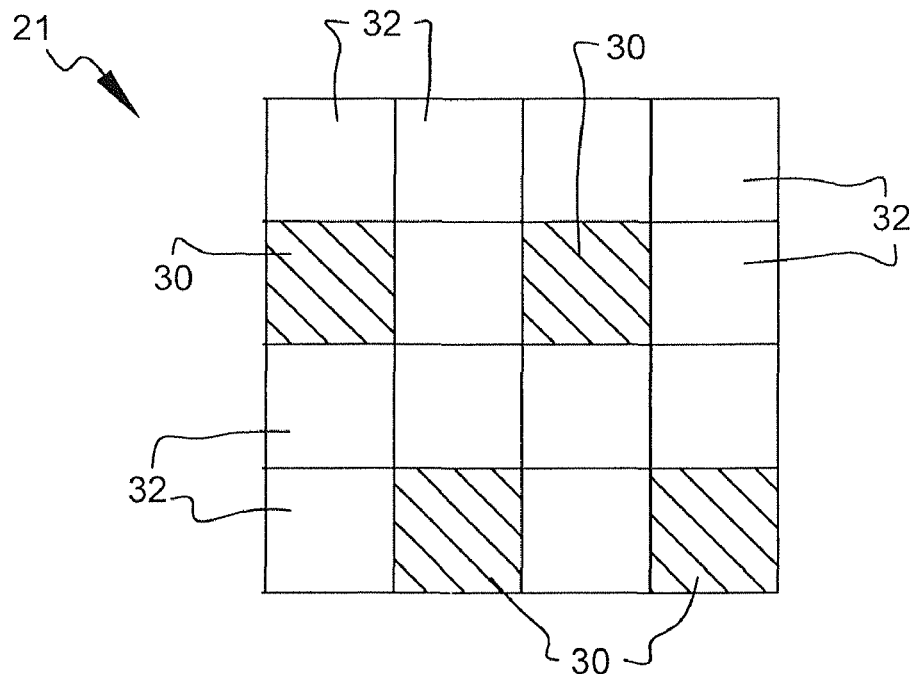
FIG. 2 is a top plan view of a portion of a wafer having fill or dummy features added on a single layer thereon.
Figure 3:
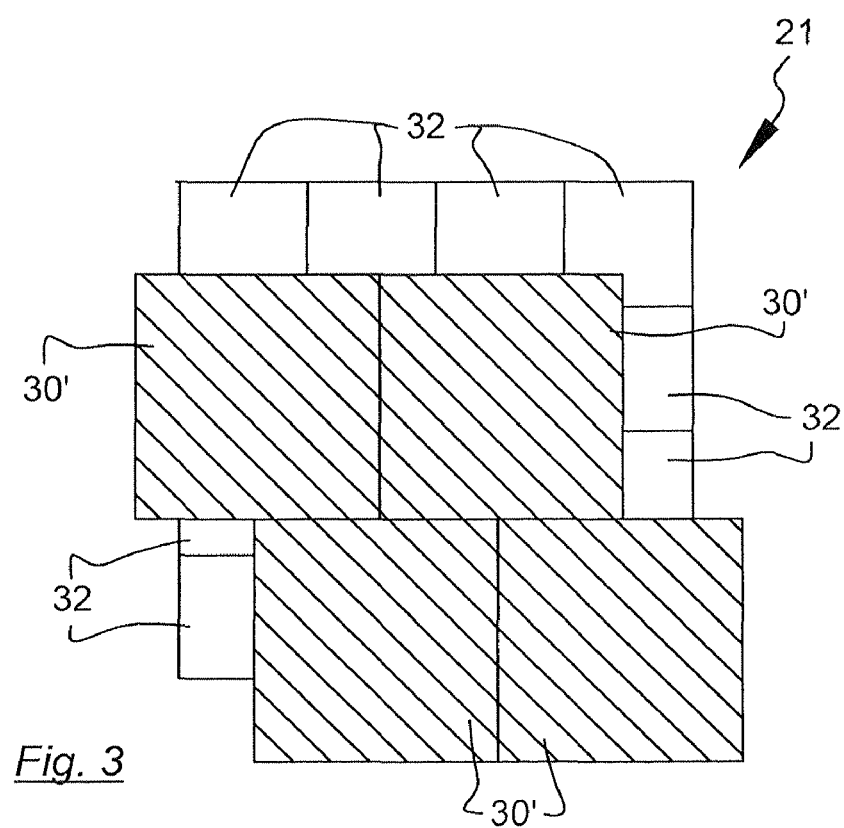
FIG. 3 is a top plan view of the portion of the wafer of FIG. 2 after applying a density correction vector to uniformly increase the size of each of the dummy features, resulting in a 100% metal density to show one extreme case of correction.
Figure 4:
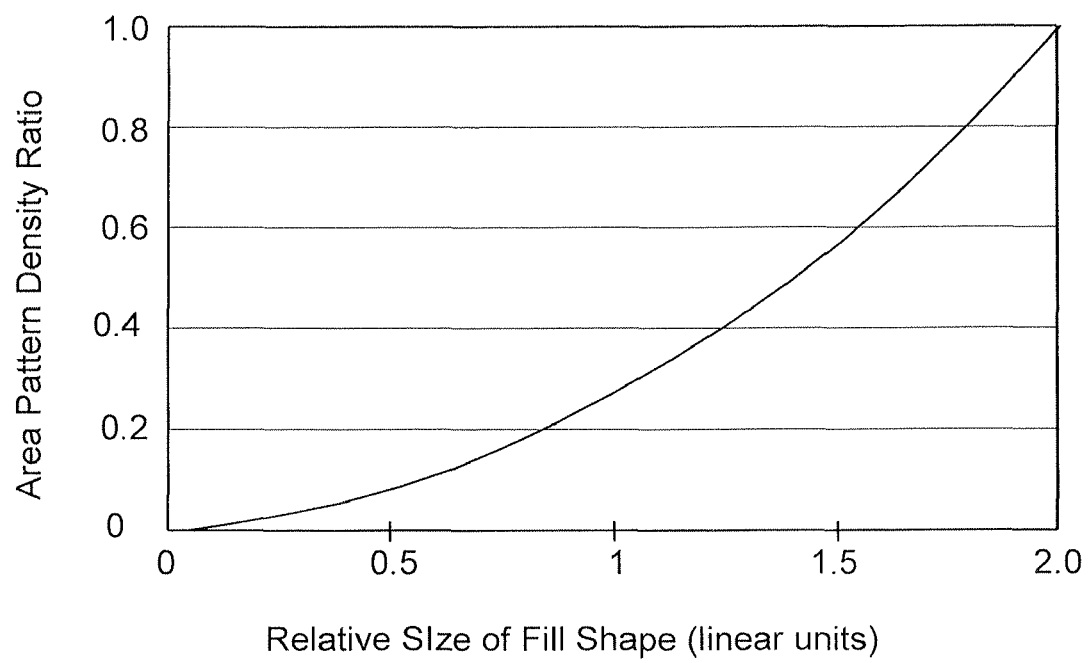
FIG. 4 is a graphical representation of the relationship of area pattern density with increasing relative size of the dummy feature in applying a density correction vector.

The present invention employs a density correction vector to achieve the desired size and layout of the fill and cheese to correct BEOL topography. An example is shown in FIGS. 2 and 3, where an initial wafer area 21 is to have fill or dummy features added on a single layer of the wafer. The area to be filled is initially subdividing into rectangles, here squares having edge dimension x, and dummy features 30 are placed in the squares at an initial determined spacing or pitch among non-filled squares 32. Area 21 has area dimension $(4x)^2$ or $16x^2$, and the initial fill area is $4x^2$, so the initial patter density is $4x^2/16x^2$, or 25%. The density correction vector uniformly increases the size of each of the dummy features 30, to a maximum of the size shown in FIG. 3, where dummy features 30' have increased the maximum amount of so that each edge is now of dimension 2x, and the dummy features now contact each other on their adjacent edges. After allowing for wrap around, where the portion of a dummy feature extending over the original edge of area 21 is transferred to the opposite edge, the pattern density has now increased to 100%. The relationship of area pattern density with increasing relative size of the dummy feature or fill shape is shown in the graph in FIG. 4, and displays a parabolic correction vector that allows a varying fill size to achieve any pattern density, while maintaining the same fill layout pitch. The consistent pitch achieved with the density correction vector will generally satisfy any layout constraints on prior or subsequent wafer layers below and above the layer shown to allow, for example, via fill to reside within prior- or subsequent-level metal fill.

Figure 5:
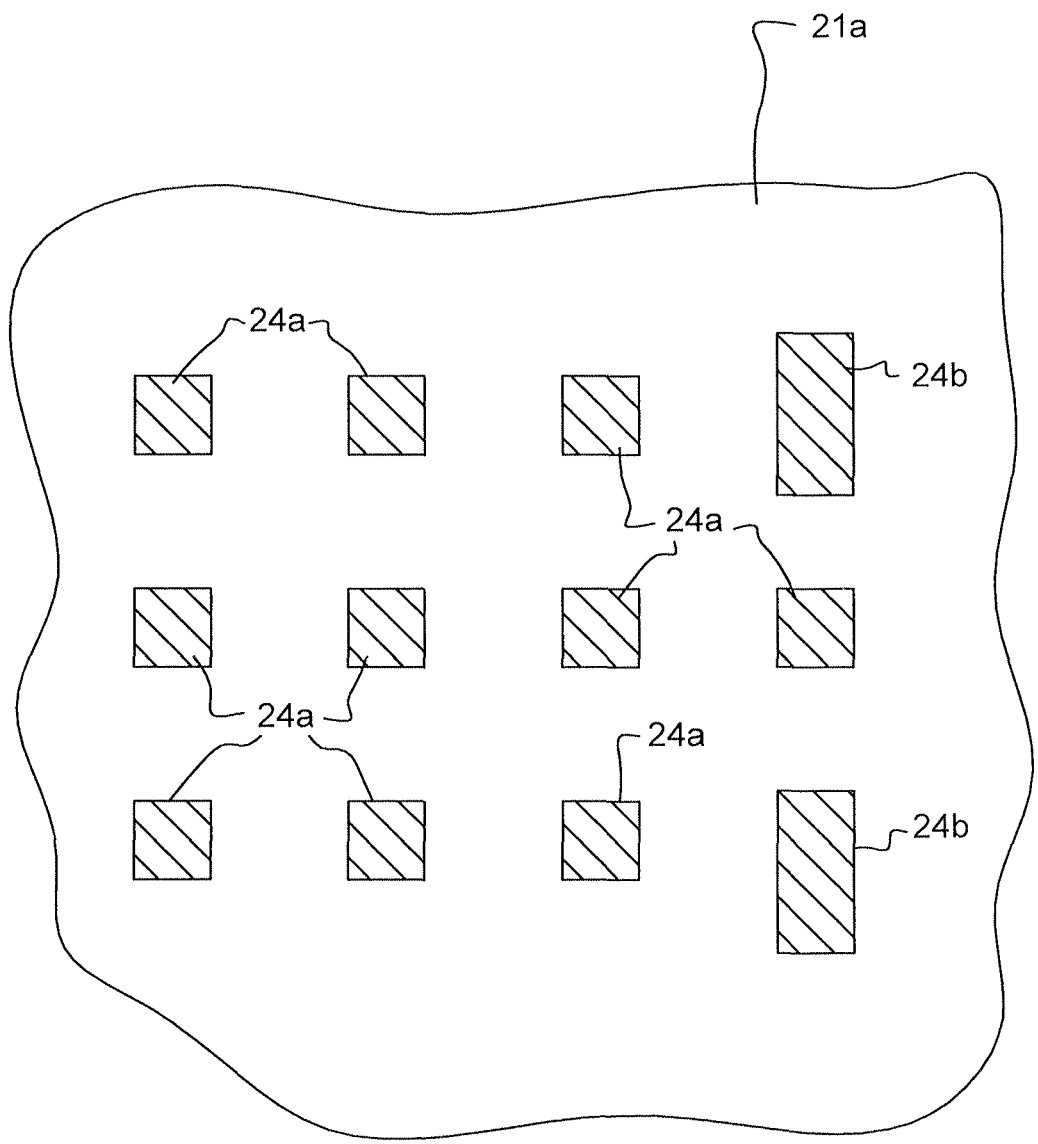
FIG. 5 is a top plan view of typical features present on a portion of a chiplet, kerf or wafer.
Figure 6:
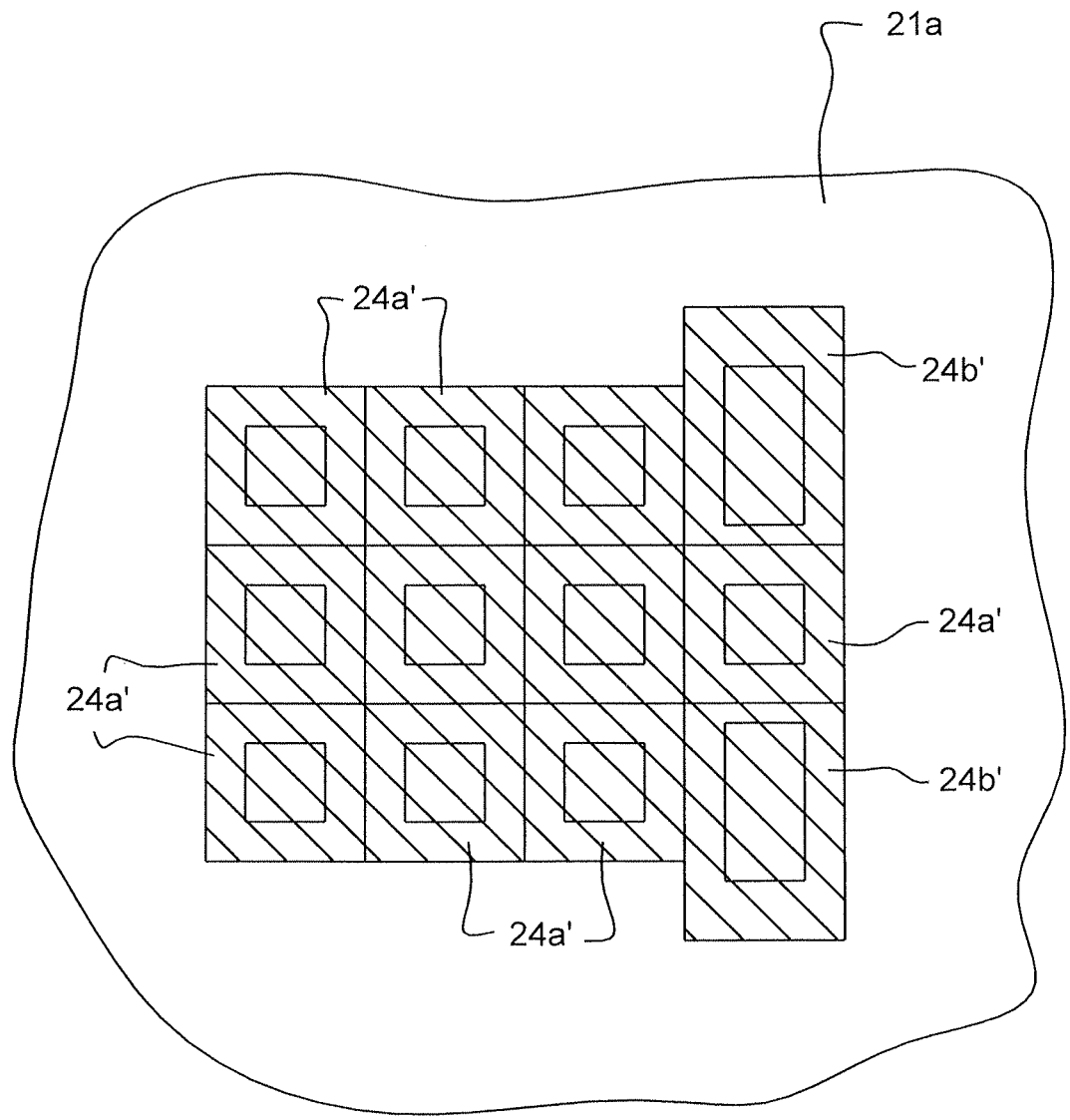
FIG. 6 is a top plan view of the features of FIG. 5 after they are expanded in order to filter out high spatial frequency patterns.
Figure 7:
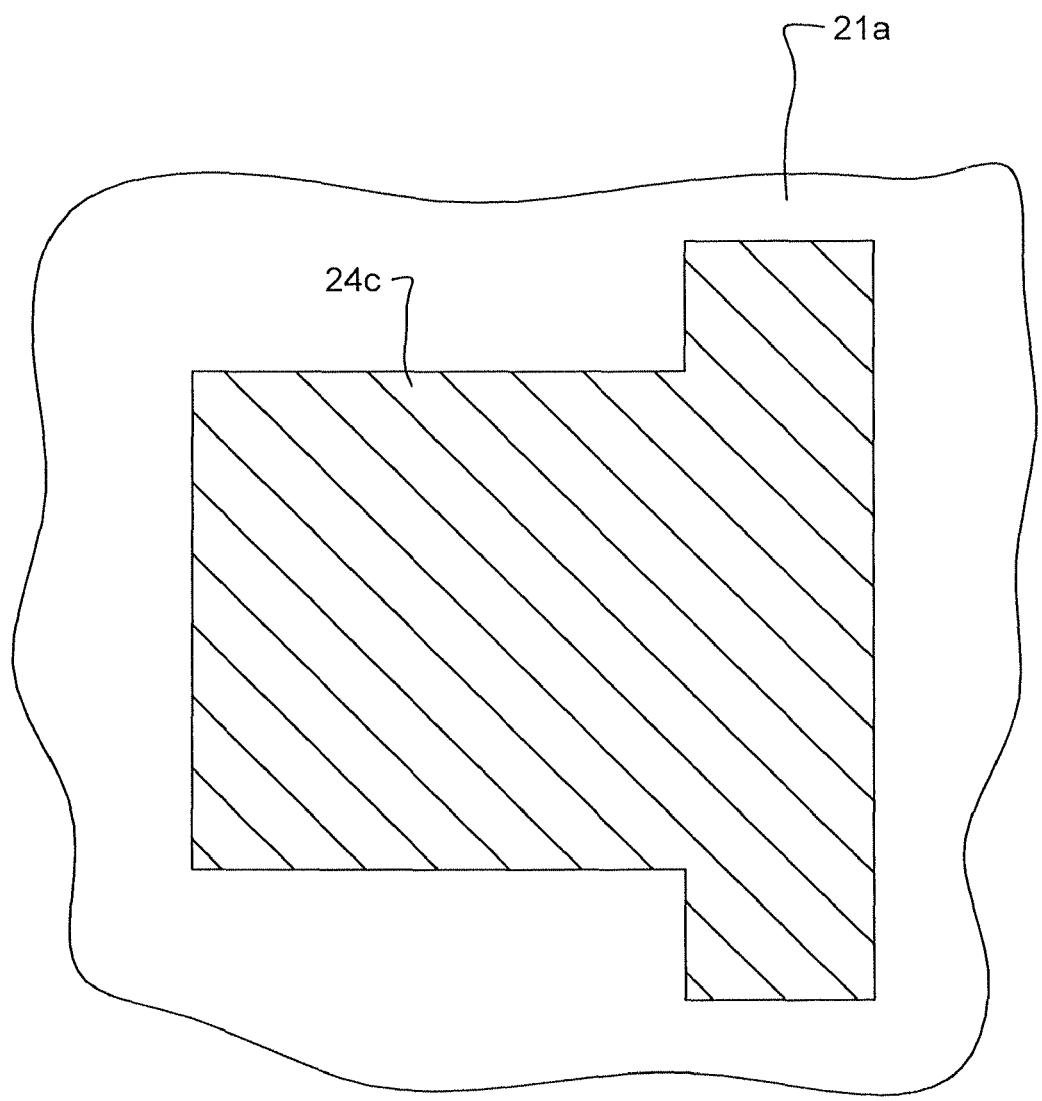
FIG. 7 is a top plan view of the expanded features of FIG. 6 after they are merged into one feature image, before calculating the pattern density map for the chiplet, kerf or wafer.

Before applying the density correction vector, the scale or frequency on which the metal feature density, also known as the pattern density, is determined. The frequency may be on the nanometer level or higher to help create the local pattern density for a given portion of the wafer. The pattern density of a given chiplet, kerf or wafer area is then compared to the pattern density of other areas on the chiplet, kerf or wafer, or on the chiplet, kerf or wafer as a whole. The high spatial frequency patterns, i.e., the smallest features, are typically filtered out to desensitize the pattern density determinations to such frequencies. An example of application of a band pass filter to accomplish this is shown in FIGS. 5-7. In FIG. 5, active features 24$a$ and 24$b$ are accurately scaled images of features present on a level of chiplet, kerf or wafer area 21$a$. In order to desensitize the pattern density determination, feature images 24$a$, 24$b$ are expanded in the manner described above by the exclusion distance desired, i.e., the distance or frequency below which a feature will not be detected in pattern density measurements. The expanded feature images 24$a$ and 24$b$ are shown in FIG. 6, as feature images 24$a'$ and 24$b'$, respectively, which in this case completely cover the region separating the originally sized feature images. The images of the separate features 24$a'$, 24$b'$ are then merged into one feature image 24$c$ in area 21$a$ (FIG. 7). The feature images are expanded by the exclusion distance before calculating the pattern density map for the chiplet, kerf or wafer.

In general, the present invention uses the density correction vector to apply a fill or cheese pattern to predetermined areas of the chiplet or kerf to meet desired pattern density for that area of the chiplet, kerf or exposure field as a whole. Several preferred embodiments are described below.

Figure 8:
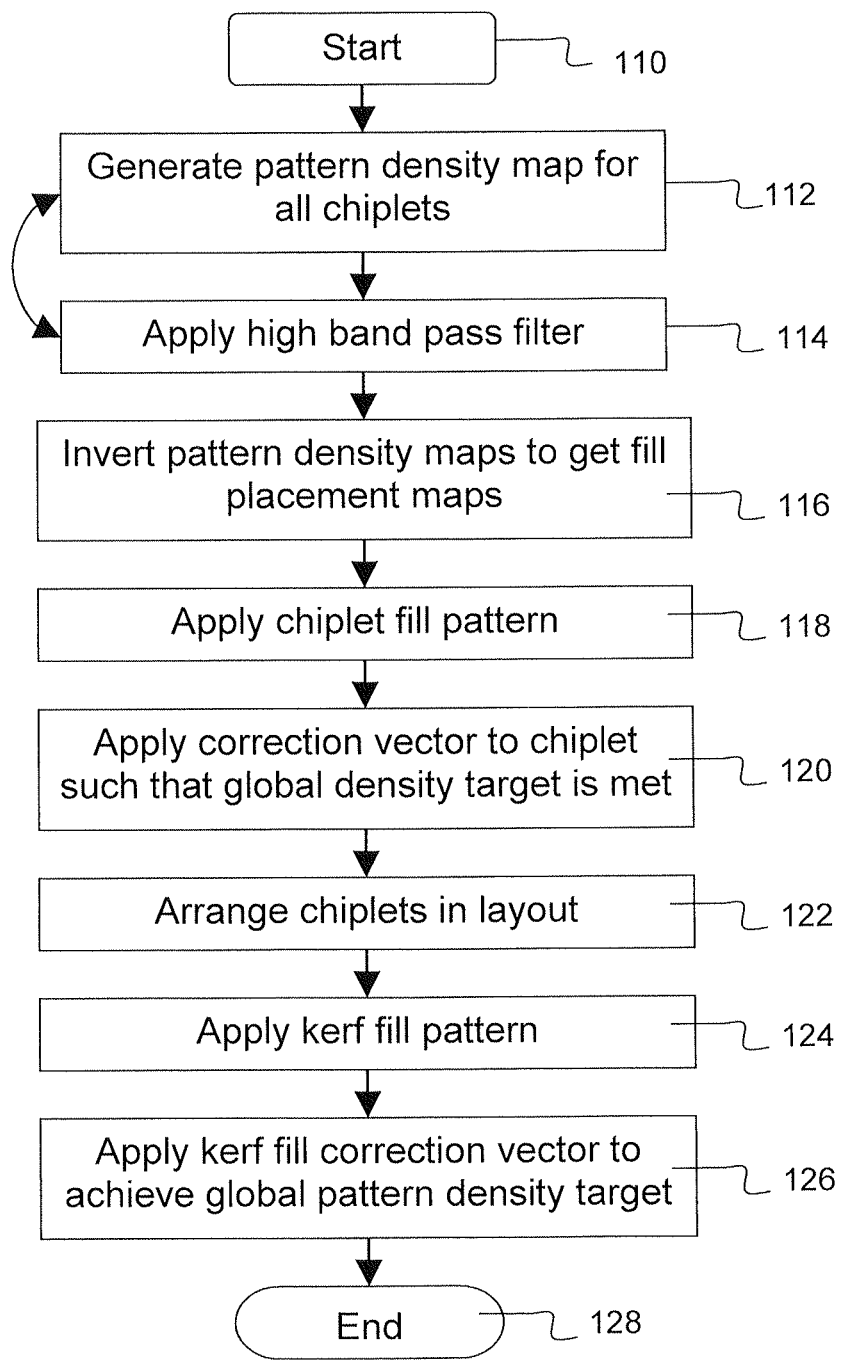
FIG. 8 is a flow chart showing the preferred steps in accordance with one embodiment of the present invention for achieving a single, uniform, global predetermined pattern density value or target, for each lithographic level on the wafer.

In a first embodiment, a single, uniform, global predetermined pattern density value or target is desired for each lithographic level on the wafer. As shown in FIG. 8, at the start 110 of the process, a pattern density map 112 is generated for all chiplets. The pattern density map may be generated either before or after a high band pass filter 114 is applied to the features on the chiplet. The high band pass filter is applied in the manner described previously, wherein features images are expanded by the exclusion distance and merged as described in connection with FIGS. 5-7. Subsequently, the pattern density maps for each chiplet is inverted 116 to obtain fill placement maps, i.e., the desired areas of interest are indicated as the regions in which features are not located, to consider fill placement for those regions devoid of features. An initial chiplet fill pattern of dummy features of desired size and pitch 118 is applied to the areas without features in each chiplet, and a density correction vector is applied to the chiplet fill pattern 120, in the manner described in connection with FIGS. 2-4, to uniformly expand or shrink the dummy features so that the global density target is met for each chiplet. After arranging or re-arranging the chiplets in the layout of the wafer 122, a similar initial fill pattern of dummy features of desired size and pitch is applied to the kerf areas 124, and a density correction vector is applied to the kerf fill pattern 126 in the manner described above to achieve the global pattern density target is met for the kerf regions on the wafer. Optionally, the fill pattern and correction vector may be applied to the kerf regions before the chiplet regions. The inputs for the fill design process in this embodiment are the pattern density target for the given level, the chiplet correction vector, and the kerf correction vector. The chiplet and kerf correction vectors may be the same or different, depending on the fill layout. Except for step 122, which can be performed at any point in the flow diagram, the steps shown in FIG. 8 are repeated for each lithographic manufacturing layer before ending 128 until the chiplets in the field are completed, so that each layer or level has a single, uniform, target pattern density, which may or may not be the same as that of the layer or level above or below it. The features and fill images created are then used to lithographically manufacture the individual wafer layers or level. This embodiment is particularly useful for situations in which the chiplets are not all the same, as in FIG. 1c, for example where they are to be used for different customers or applications, and/or the various chiplet designs are submitted at different times during the design process.

Figure 9:
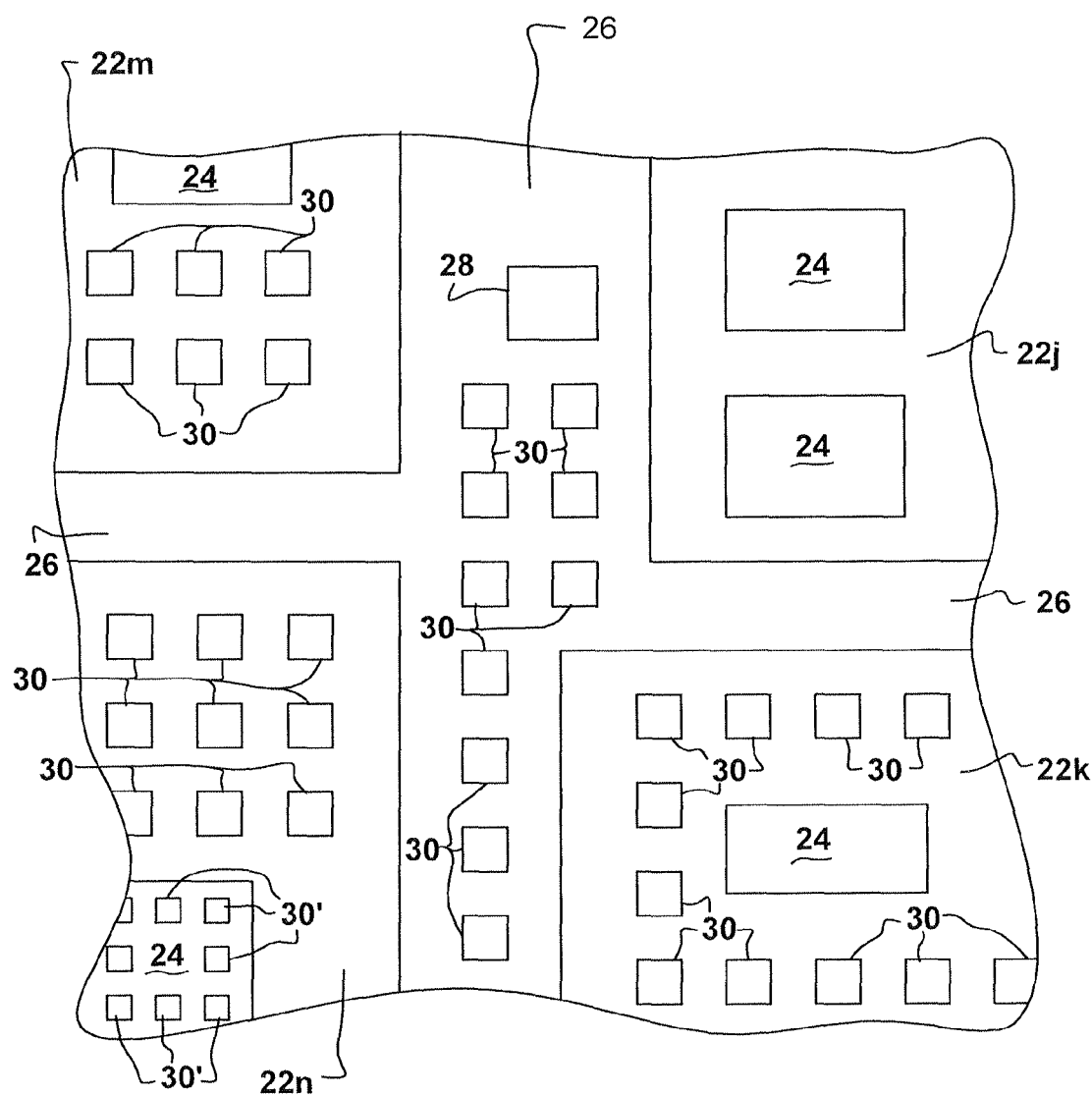
FIG. 9 is a top plan view of a portion of a wafer having functional features in chiplet and kerf areas, and overlaid with a fill pattern determined in accordance with the method of FIG. 8.

FIG. 9 shows a portion of a wafer having chiplets 22j, 22k, 22m, 22n with functional or active features 24, separated by kerf areas 26 having a functional feature 28, all arranged with the same exposure field. In accordance with the aforedescribed method, fill or dummy features 30 have been added to the appropriate chiplet and kerf areas, and adjusted with a correction vector, to achieve a substantially uniform predetermined pattern density target for the lithographic level shown. While the fill features have been depicted herein as being of square configuration, other configurations may be employed as desired.

If necessary, instead of using a fill pattern to add additional metal or other dummy features to chiplet or kerf regions, a cheese pattern may be applied to metal features, and a correction vector employed to the cheese sizes, to reduce the density of large metal regions and match the target density in a manner that does not affect functionality of the electronic device or electrical connector. For example, a large metal region used as an electrical conductor, such as a wide metal line, may have discrete portions of metal removed so that the resulting structure or matrix of metal still conducts electricity, but has a lower metal density so as to provide more uniform resistance to CMP as compared to neighboring regions. In FIG. 9, a cheese pattern of voids of openings 30' is shown in the large metal feature 24 of chiplet 22n.

Figure 10:
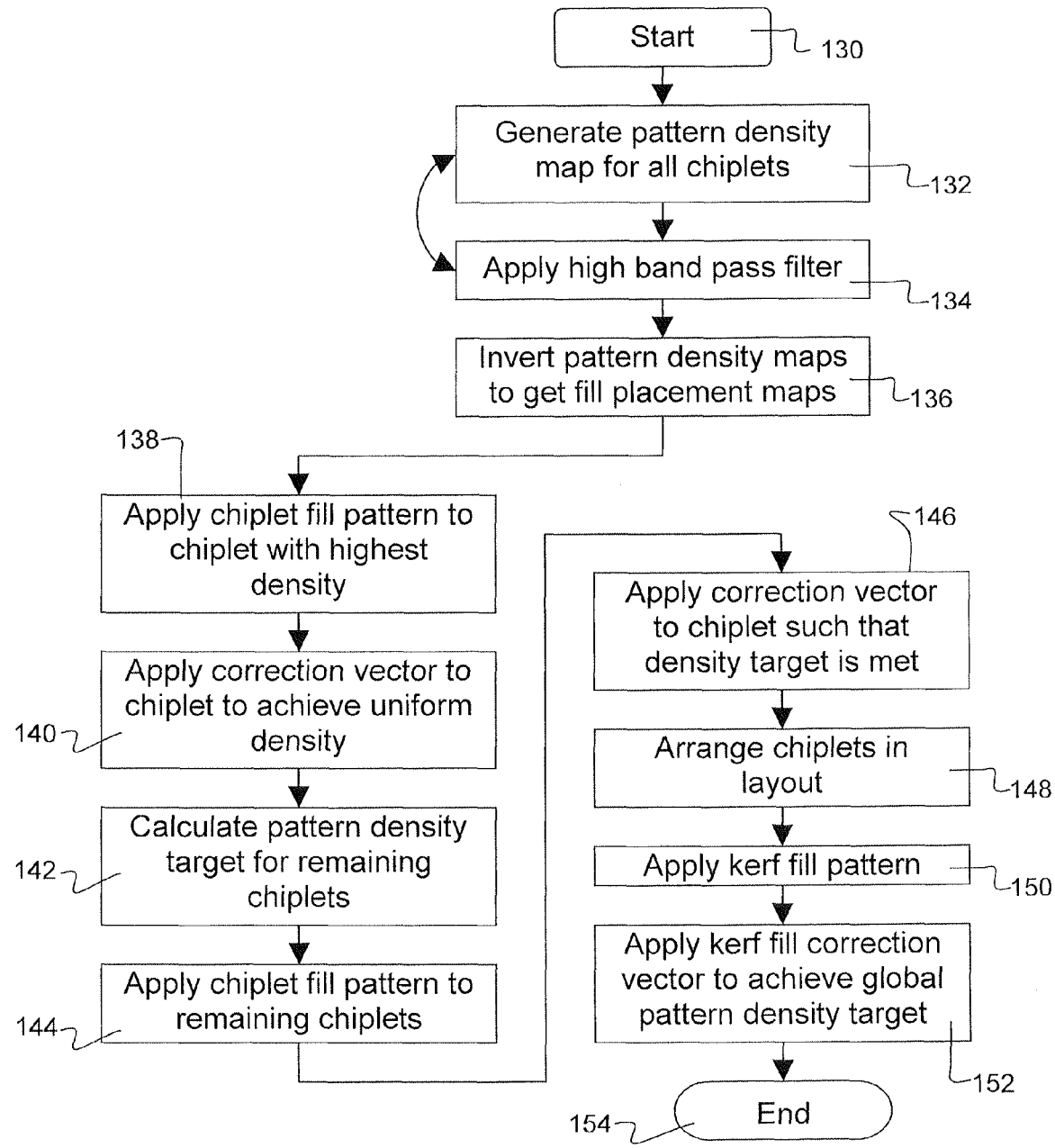
FIG. 10 is a flow chart showing the preferred steps in accordance with another embodiment of the present invention for achieving a pattern density for each chiplet that will match that of the chiplet having the highest pattern density, for each lithographic level on the wafer.

In another embodiment shown in FIG. 10, instead of seeking a single, uniform, global predetermined pattern density target, it is desired to achieve a pattern density for each chiplet that will match that of the chiplet having the highest pattern density. In starting the process 130, initially, a pattern density map is generated for all chiplets 132 to be lithographically manufactured on a layer or level on a wafer, and a high band pass filter is applied 134 (again in either order), until the desired degree of sensitivity to chiplet features is achieved. To obtain the fill or cheese placement maps, the pattern density maps for the chiplets are inverted 136. For the chiplet having the highest density region of features within the chiplet, a fill (dummy) pattern is applied 138 within the regions not having that feature density, and a correction vector is applied to the fill pattern 140 until the fill is enlarged (or shrunk) so that the chiplet has a uniform feature pattern density matching the original highest feature pattern density. Using the same highest feature pattern density, the target pattern density is calculated for the remaining chiplets 142, and a fill pattern is applied to those other chiplets 144 and a correction vector is applied to the fill pattern to meet the target highest pattern density 146. The chiplets are then arranged in a layout 148 on the wafer. Subsequently, the fill pattern is applied to the kerf regions between the chiplets 150 and the fill correction vector is applied to the kerf fill pattern to match the target highest pattern density 152. Optionally, the fill pattern and correction vector may be applied to the kerf regions before the chiplet regions. If necessary, a cheese pattern and correction vector are applied to large metal feature areas to match the target density. Before ending 154, the steps are repeated (except for step 148) for each wafer layer, so that each layer or level uses the target pattern density of the portion of the chiplet having the highest pattern density regions. The target pattern density is not necessarily the same, then, as the adjacent layer or level of the wafer. The inputs for the fill design process in this embodiment are the same as those for the embodiment of FIG. 8, and this embodiment is also useful for situations in which the various chiplet designs are submitted at different times during the design process.

Figure 11:
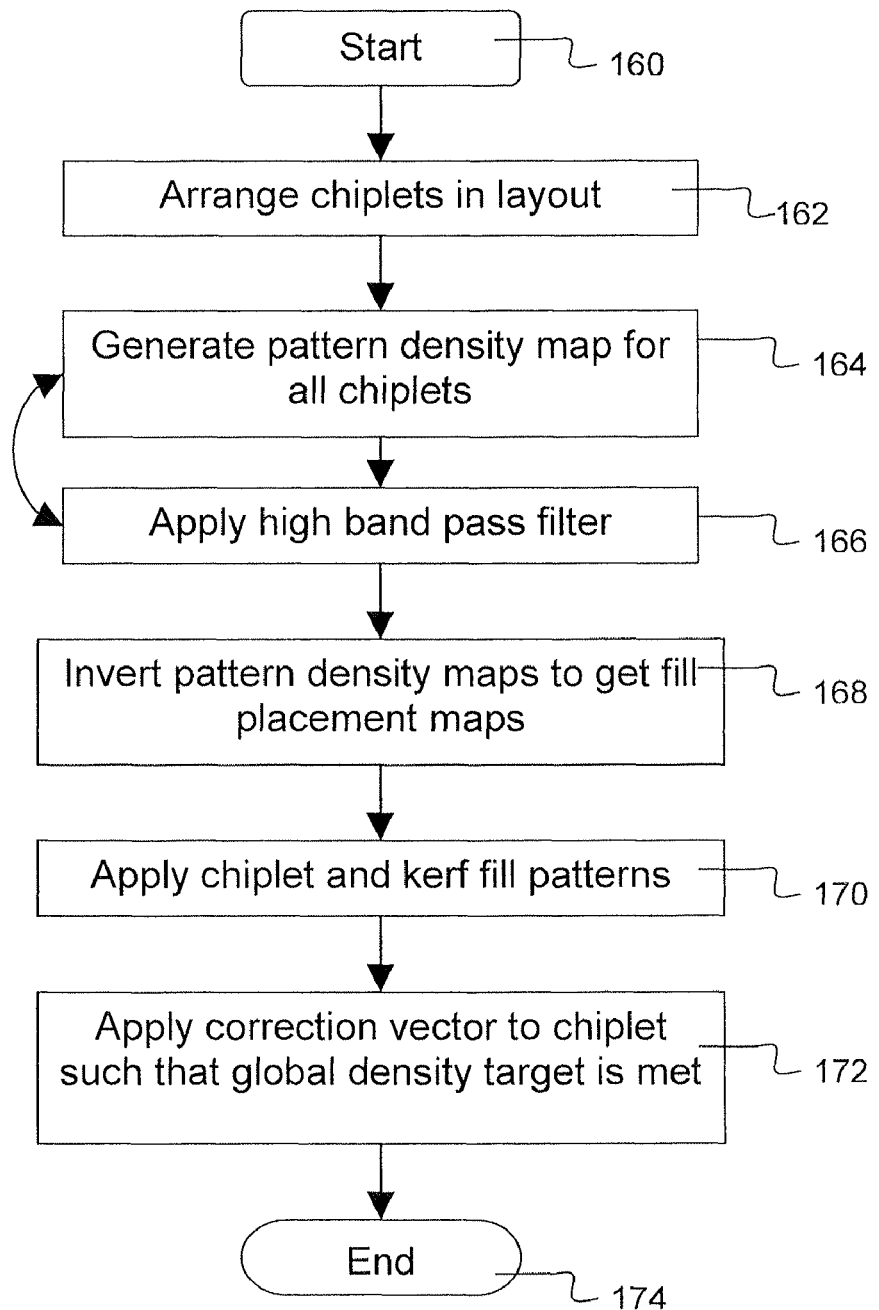
FIG. 11 is a flow chart showing the preferred steps in accordance with another embodiment of the present invention for achieving a single, uniform, global predetermined pattern density target, for each lithographic level on the wafer.

The embodiment shown in FIG. 11 is the same as that shown in FIG. 8, except that on each layer or level the fill pattern is applied to the chiplet and kerf regions simultaneously. The target density of a single, uniform, global predetermined pattern density value is determined for each lithographic level on the wafer. On the start 160 for the first level, the chiplets are arranged in the desired layout 162, followed by the generating of the pattern density map for all chiplets 162 and the application of a desired high band pass filter 164, in either order. After inverting the pattern density maps obtain the fill placement maps 168, initial fill patterns are applied to the chiplet and kerf regions at the same time, and a correction vector is also applied, to achieve the target density for that level. Before ending 174, the steps are repeated for each layer or level of the wafer. This embodiment is especially useful for development test sites or layouts, or single customer layouts.

Figure 12:
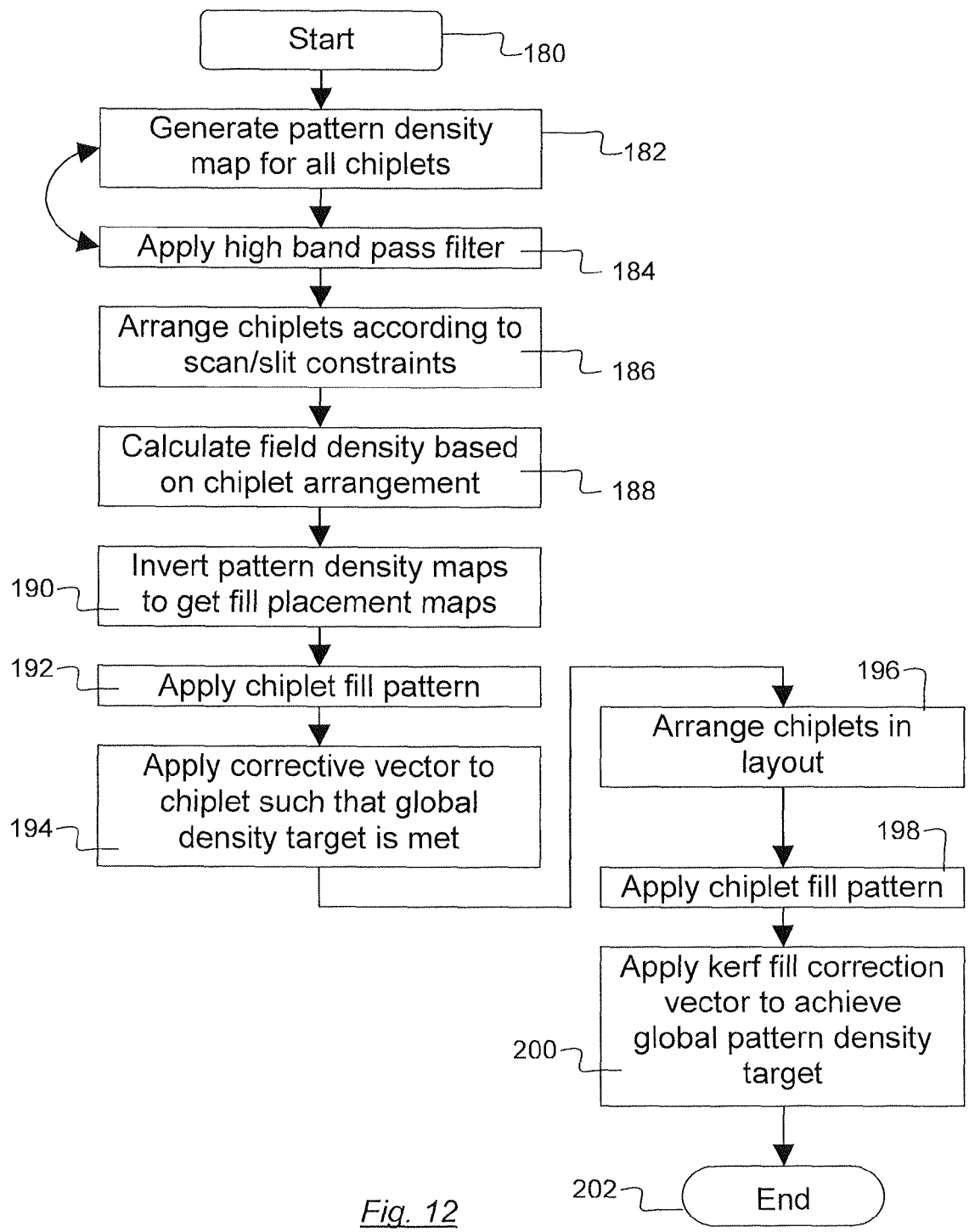
FIG. 12 is a flow chart showing the preferred steps in accordance with another embodiment of the present invention for achieving a target gradient of pattern density that is relatively constant in the lithographic scanner slit direction, and varying in the scan direction.
Figure 13:
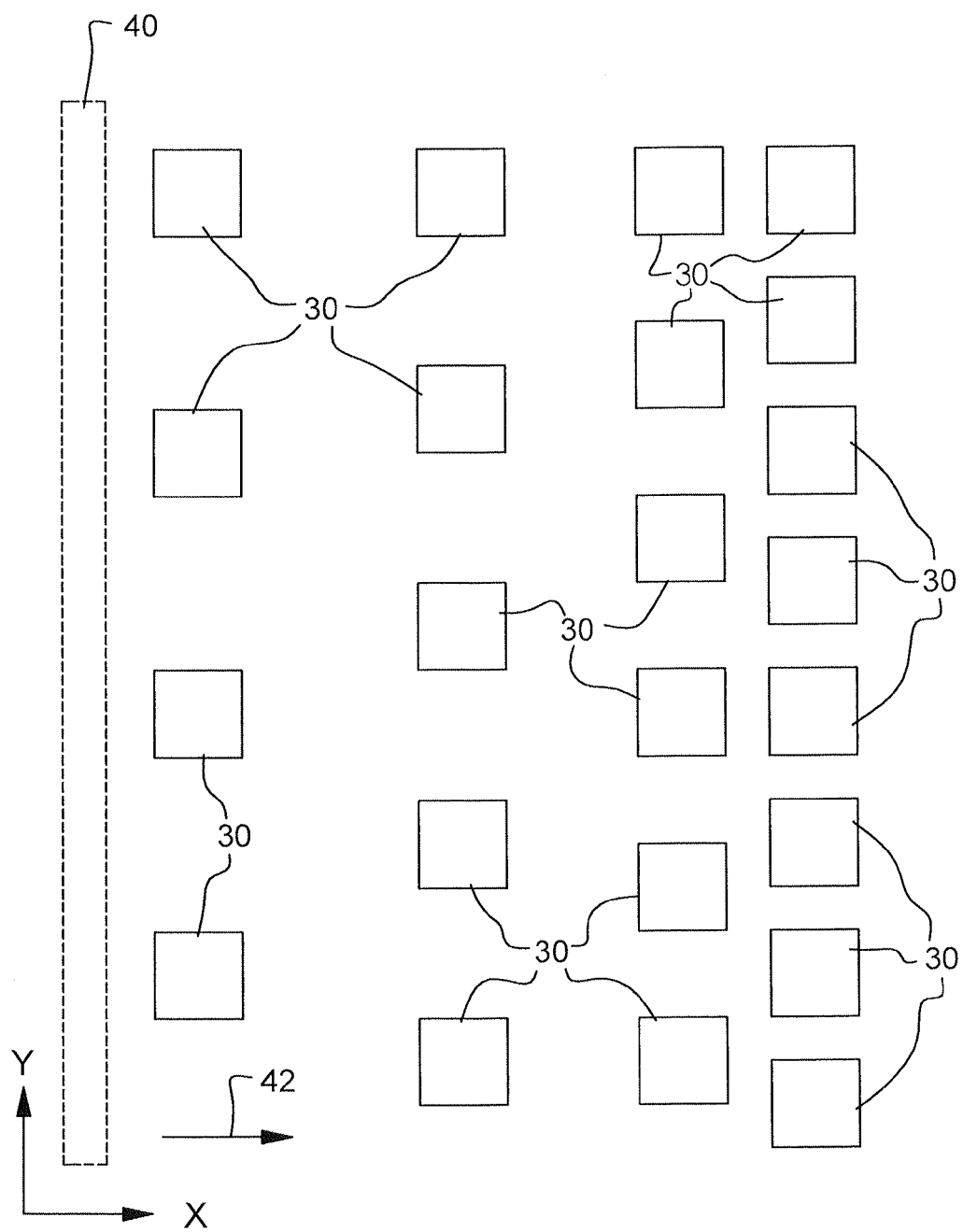
FIG. 13 is a top plan view of a slit of a lithographic scanner in relation to fill features of varying pattern density.

FIG. 12 depicts another embodiment wherein the density is not restricted to be uniform across the wafer, and a different density is permitted for different chiplets. In particular, it is desirable that pattern density of the chiplets and kerf remain relatively constant along the direction of the slit in the scanner used to lithographically manufacture the wafer level, and that any change in pattern density occur in the direction of scan of the slit. As shown in FIG. 13, a wafer has a pattern of fill or dummy features 30 that are to be scanned by slit 40 on a conventional lithographic scanner. Slit 40 extends in the y-direction, and is scanned over the features by movement in the x-direction, designated by arrow 42. Features 40 have a relatively constant density in the slit or y-direction and have a varying density in the scan or x-direction, from a lower density on the left to a higher density on the right. The same concept can be applied to arrangement of chiplets, for example, where chiplets of lower density may be arranged along the slit axis on the left side of the wafer, and gradually increase in density as the slit is scanned to the right, until the higher density chips are arranged along the slit axis on the right side of the wafer. For optimal results, chiplets of similar density are also arranged at the beginning and end of the scan sequence, such that areas of similar pattern density from adjacent exposure fields abut one another.

Referring back to FIG. 12, start 180 comprises, as before, initially generating a pattern density map for all chiplets 182 and applying a high band pass filter 184, in either order. The chiplets are then arranged on the wafer by feature density according to the constraints of the slit direction and scan direction 186. A field density is then calculated based on the chip arrangement 188, and the pattern density map is inverted to get the fill placement map 190. The fill pattern is applied to the chiplets 192 and the correction vector is applied to the chiplet fill 194, to achieve the same density as the local chiplets have along the slit direction. The kerf fill pattern is then applied and the correction vector is applied to the kerf fill 200 to achieve the same target pattern density as the local chiplets have along the scan density. In this embodiment, the kerf fill pattern is varied to provide a gradient between the pattern density of one chiplet and the different pattern density of another chiplet, in the scan direction. The result is in both the chiplets and kerf a gradually varying feature density in the scan direction and a relatively constant feature density in the slit direction, across the entire wafer. This embodiment reduces defocus-induced feature dimension variations across the slit during lithographic processing, and is useful where different customers submit different chiplets at different times to be manufactured on a single wafer.

In each embodiment, the design of the fill or cheese patterns are integrated with the design of the functional chiplet and kerf features, and the resulting design pattern for that wafer level is created on each wafer layer or level using otherwise conventional lithographic fabrication techniques.

Thus, the present invention mitigates variations in BEOL topography during the lithographic production of integrated circuit devices on semiconductor wafers, by providing fill or dummy features on levels or layers of lithographically produced electronic devices that promote uniform planarizing by chemical mechanical polishing of the wafer surface.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of designing features on a semiconductor wafer comprising:
    providing a semiconductor wafer;
    providing a design of active or functional features of different frequencies for chiplets to be formed on the wafer;
    determining pattern density of the active or functional features on the chiplets while filtering out high frequency active or functional features to desensitize the determined active or functional pattern density to the high frequency features;
    applying a pattern of spaced dummy features on an area of at least one chiplet not covered by active or functional features; and
    uniformly expanding or reducing size of the dummy features until a desired pattern density of the dummy features in the area is reached, matching the desensitized active or functional pattern density.

2. The method of claim 1 further including arranging the chiplets in an exposure field in a desired spaced layout, the chiplets being separated by kerf areas; applying a pattern of spaced dummy features on the kerf areas; and uniformly expanding or reducing size of the dummy features until pattern density of the dummy features in the kerf areas substantially matches the pattern density of the dummy features in the chiplets adjacent the kerf areas.

3. The method of claim 2 wherein the patterns of dummy features are applied to the at least one chiplet and the kerf areas sequentially.

4. The method of claim 2 wherein the patterns of dummy features are applied to the at least one chiplet and the kerf areas simultaneously.

5. The method of claim 1 further including expanding and merging at least some of the active or functional features for the chiplets prior to determining pattern density of the features.

6. The method of claim 1 wherein a pattern of spaced dummy features is applied on areas of a plurality of chiplets not covered by active or functional features, and wherein the desired pattern density of the dummy features in the chiplet area is predetermined to be substantially uniform in the plurality of chiplets.

7. The method of claim 1 wherein a pattern of spaced dummy features is applied on areas of a plurality of chiplets not covered by active or functional features, and wherein the desired pattern density of the dummy features in the chiplet area is predetermined to substantially match the highest pattern density of the active or functional features in the chiplets.

8. The method of claim 1 wherein a pattern of spaced dummy features is applied on areas of a plurality of chiplets not covered by active or functional features, and wherein the desired pattern density of the dummy features in the chiplet area is predetermined to vary substantially uniformly across an exposure field.

9. The method of claim 8 further including arranging the chiplets in the exposure field in a desired spaced layout, the chiplets being separated by kerf areas; applying a pattern of spaced dummy features on the kerf areas; and uniformly expanding or reducing size of the dummy features until pattern density of the dummy features in the kerf areas varies substantially uniformly across the exposure field and substantially matches the pattern density of the dummy features in the chiplets adjacent the kerf areas.

10. The method of claim 9 wherein variation of the pattern density is in the direction of scan of the exposure field during lithographic production.

11. A method of designing features on a semiconductor wafer comprising:
    providing a semiconductor wafer;
    providing a design of active or functional features for a plurality of chiplets to be formed on the wafer, the chiplets being arranged in an exposure field in a desired spaced layout and separated by kerf areas having different pattern densities of the active or functional features;
    determining pattern density of the active or functional features on each of the chiplets;

determining the chiplet having the highest pattern density of the active or functional features;

applying a pattern of spaced dummy features on an area of at least one chiplet areas of the chiplets not covered by active or functional features; and uniformly expanding or reducing size of the dummy features until pattern density of the dummy features substantially matches the pattern density of the chiplet having the highest pattern density of the active or functional features.

12. The method of claim 11 wherein the patterns of dummy features are applied to the at least one chiplet and the kerf areas sequentially.

13. The method of claim 11 wherein the patterns of dummy features are applied to the at least one chiplet and the kerf areas simultaneously.

14. The method of claim 11 wherein a pattern of spaced dummy features is applied on areas of a plurality of chiplets not covered by active or functional features, and wherein the desired pattern density of the dummy features in the chiplet area is predetermined to be substantially uniform in the plurality of chiplets.

15. A method of designing features on a semiconductor wafer comprising:

providing a semiconductor wafer oriented along an x- and y-direction;

providing a design of active or functional features for chiplets to be formed on the wafer, the active or functional features having a substantially constant density in the y-direction on the wafer and a varying density, from a lower density to a higher density, in the x-direction;

determining pattern density of the active or functional features on the chiplets;

applying a pattern of spaced dummy features on an area of at least one chiplet not covered by active or functional features; and uniformly expanding or reducing size of the dummy features until pattern density of the dummy features have a substantially constant density in the y-direction on the wafer and a varying density, from a lower density to a higher density, in the x-direction, substantially matching the pattern density of the active or functional features.

16. The method of claim 15 wherein the pattern density variation is in the direction of scan of exposure field during lithographic production.

* * * * *